United States Patent
Ebi et al.

(10) Patent No.: US 7,505,824 B2
(45) Date of Patent: Mar. 17, 2009

(54) AUDIO SIGNAL PROCESSING APPARATUS AND AUDIO SIGNAL PROCESSING METHOD

(75) Inventors: Masaru Ebi, Kanagawa-ken (JP); Yasuyuki Suzuki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 624 days.

(21) Appl. No.: 11/180,718

(22) Filed: Jul. 14, 2005

(65) Prior Publication Data
US 2006/0015199 A1    Jan. 19, 2006

(30) Foreign Application Priority Data
Jul. 14, 2004    (JP)    ............................. 2004-206633

(51) Int. Cl.
*G06F 17/00* (2006.01)
*H03G 3/00* (2006.01)

(52) U.S. Cl. .................. 700/94; 381/104; 381/109; 381/59; 330/136; 330/297; 375/345; 455/235.1

(58) Field of Classification Search .................. 700/94; 455/235.1
See application file for complete search history.

(56) References Cited

U.S. PATENT DOCUMENTS

| | | | | |
|---|---|---|---|---|
| 4,445,095 | A * | 4/1984 | Carver | 330/297 |
| 5,471,651 | A * | 11/1995 | Wilson | 455/72 |
| 5,617,058 | A * | 4/1997 | Adrian et al. | 330/10 |
| 5,666,426 | A | 9/1997 | Helms | |
| 5,909,145 | A * | 6/1999 | Zimmerman | 330/128 |
| 5,959,500 | A * | 9/1999 | Garrido | 330/151 |
| 6,285,251 | B1 * | 9/2001 | Dent et al. | 330/127 |
| 6,373,334 | B1 * | 4/2002 | Melanson | 330/10 |
| 6,385,322 | B1 * | 5/2002 | Mietling | 381/82 |
| 6,600,376 | B1 * | 7/2003 | Yang | 330/297 |
| 6,606,044 | B2 * | 8/2003 | Roeckner et al. | 341/143 |
| 6,784,748 | B1 * | 8/2004 | Canyon et al. | 330/296 |
| 7,026,866 | B2 * | 4/2006 | Llewellyn | 330/9 |
| 7,026,868 | B2 * | 4/2006 | Robinson et al. | 330/10 |
| 7,043,213 | B2 * | 5/2006 | Robinson et al. | 455/127.2 |
| 7,071,777 | B2 * | 7/2006 | McBeath et al. | 330/149 |
| 7,161,428 | B2 * | 1/2007 | Mendenhall | 330/251 |
| 7,212,640 | B2 * | 5/2007 | Bizjak | 381/106 |
| 7,239,200 | B2 * | 7/2007 | Ishii et al. | 330/10 |
| 7,305,346 | B2 * | 12/2007 | Oyama et al. | 704/503 |
| 2002/0090096 | A1 * | 7/2002 | Blind et al. | 381/104 |
| 2003/0169112 | A1 * | 9/2003 | Takahashi et al. | 330/254 |

(Continued)

*Primary Examiner*—Curtis Kuntz
*Assistant Examiner*—Paul McCord
(74) *Attorney, Agent, or Firm*—Oblon, Spivak, McClelland, Maier & Neustadt, P.C.

(57) ABSTRACT

An audio signal processing apparatus and method in which power supplied to a power amplifier is controlled in a wide range from a small output power level to a large output power level in accordance with input audio signals. The apparatus includes an interface unit configured to convert input audio signals to digital audio signals, a digital signal processor configured to process the digital audio signals converted by the interface unit, a volume unit configured to adjust a volume of the digital audio signal processed by the digital signal processor and generate at least one volume modulated signal, and an amplifier configured to amplify the at least one volume modulated signal, wherein power supplied to the amplifier is based on a level of the digital audio signal converted by the interface unit and the at least one volume modulated signal from the volume unit.

19 Claims, 6 Drawing Sheets

U.S. PATENT DOCUMENTS

2004/0001586 A1* 1/2004 Melsa et al. ........... 379/399.01
2004/0013263 A1* 1/2004 Maclean et al. ........ 379/387.01
2004/0084968 A1* 5/2004 Lee et al. ...................... 307/66
2005/0272378 A1* 12/2005 Dupuis .................... 455/67.15

* cited by examiner

AUDIO SIGNAL PROCESSING APPARATUS AND AUDIO SIGNAL PROCESSING METHOD

CROSS-REFERENCE TO RELATED APPLICATIONS

This application claims priority from, and the benefit of, Japanese Patent Application No. 2004-206633, filed on Jul. 14, 2004, the contents of which are expressly incorporated herein by reference in their entirety.

BACKGROUND OF THE INVENTION

1. Field of the Invention

The present invention relates to an audio signal processing apparatus and method, and more particularly, to an audio signal processing apparatus and method that may supply a suitable power to an amplifier in accordance with an output level of an audio signal so as to perform the amplification with high efficiency from a small output level to a large output level.

2. Background of the Invention

An audio signal processing apparatus applicable to an audio apparatus using, audio disks, such as a mini-disk (MD),a compact disk (CD),or a digital versatile disk (DVD) provides an audio power amplifier (PA) for amplifying and driving an audio speaker and a power supplier in order to supply a power corresponding to a maximum output value of the audio signal.

Usually, a power supplier for an audio apparatus is designed so it can supply the maximum power to an amplifier when the audio output volume is maximized, while maintaining a constant voltage. For instance, Japanese Patent Application Publication 2001-77634 discloses such an audio signal processing apparatus in that a power supplier can supply maximum voltages +Vdd (hereinafter referred to be as "+B") and −Vdd (hereinafter referred to be as "−B") at a maximized volume time. After modulating the volume of the audio input signal, the amplified audio signal is outputted through an output terminal. The audio power amplifier in this audio signal processing apparatus operates as an analog amplifier of class "A" amplification, class "B" amplification or class "AB" amplification at the maximum voltages +Vdd and −Vdd.

However, the conventional audio signal processing apparatus supplies the maximum voltages +Vdd and −Vdd to the audio power amplifier even when the volume of the audio output is rather a small level or a middle level. Thus, the audio signal processing apparatus always operates at the maximum voltages +Vdd and −Vdd, while a power load efficiency ($\eta_{add}$) is approximately several percent (%) reduced from the audio maximum output time during a normal calculation time. Since the conventional audio signal processing apparatus always generates useless power at a normal calculation time, a mean power load efficiency ($\eta_{add}$) is extremely reduced. Accordingly, the conventional audio signal processing apparatus has problems and defects for supplying power to the amplifier.

SUMMARY OF THE INVENTION

The present invention avoids the above-explained problems and defects of the conventional audio signal processing apparatus and provides an audio signal processing apparatus that realizes high efficiency in an amplifier over a wide range of output levels from a small output level to a large output level while avoiding wasted generation of power during a normal output level.

According to one aspect of the present invention, there is provided an audio signal processing apparatus including:
an interface unit configured to convert input audio signals to digital audio signals;
a digital signal processor configured to process the digital audio signals converted by the interface unit;
a volume unit configured to adjust a volume of the digital audio signal processed by the digital signal processor and generate at least one volume modulated signal;
an amplifier configured to amplify the volume modulated signal generated by the volume unit and to output an amplified audio signal;
a power supplier configured to supply a power to the amplifier;
a level detector configured to detect a level of the digital audio signal converted by the interface unit and generate a level signal; and
a calculation unit configured to calculate a power condition based on the level signal from the level detector and the at least one volume modulated signal from the volume unit, wherein a level of the power supplied by the power supplier to the amplifier is based on the calculated power condition.

According to another aspect of the present invention, there is provided an audio signal processing method including:
converting input audio signals to digital audio signals;
processing the digital audio signals from the converting step to produce processed digital audio signals;
generating at least one volume modulated signal based on the processed digital audio signals;
detecting a level of the digital audio signal in the converting step;
calculating a power condition based on the level detected in the detecting step and the at least one volume modulated signal generated in the generating step;
supplying a power to an amplifier based on the calculated power condition;
amplifying the at least one volume modulated signal with the amplifier to produce an amplified output signal; and
outputting the amplified output signal.

According to another aspect of the present invention, there is provided an audio signal processing apparatus including:
an interface unit configured to convert input audio signals to digital audio signals;
a digital signal processor configured to process the digital audio signals converted by the interface unit;
a volume unit configured to adjust a volume of the digital audio signal processed by the digital signal processor and generate at least one volume modulated signal;
an amplifier configured to amplify the at least one volume modulated signal; and
means for supplying power to the amplifier based on a level of the digital audio signal converted by the interface unit and the at least one volume modulated signal from the volume unit.

Further features, aspects, and advantages of the present invention will become apparent from the detailed description of embodiments that follows, when considered together with the accompanying figures of the drawings.

BRIEF DESCRIPTION OF THE DRAWINGS

The accompanying drawings, which are incorporated in and constitute part of this specification, illustrate various embodiments and/or features of the present invention, and together with the description, serve to explain the present invention. Where possible, the same reference number will be used throughout the drawings to describe the same or like parts. In the drawings.

DESCRIPTION OF THE EMBODIMENTS

Figure 1:
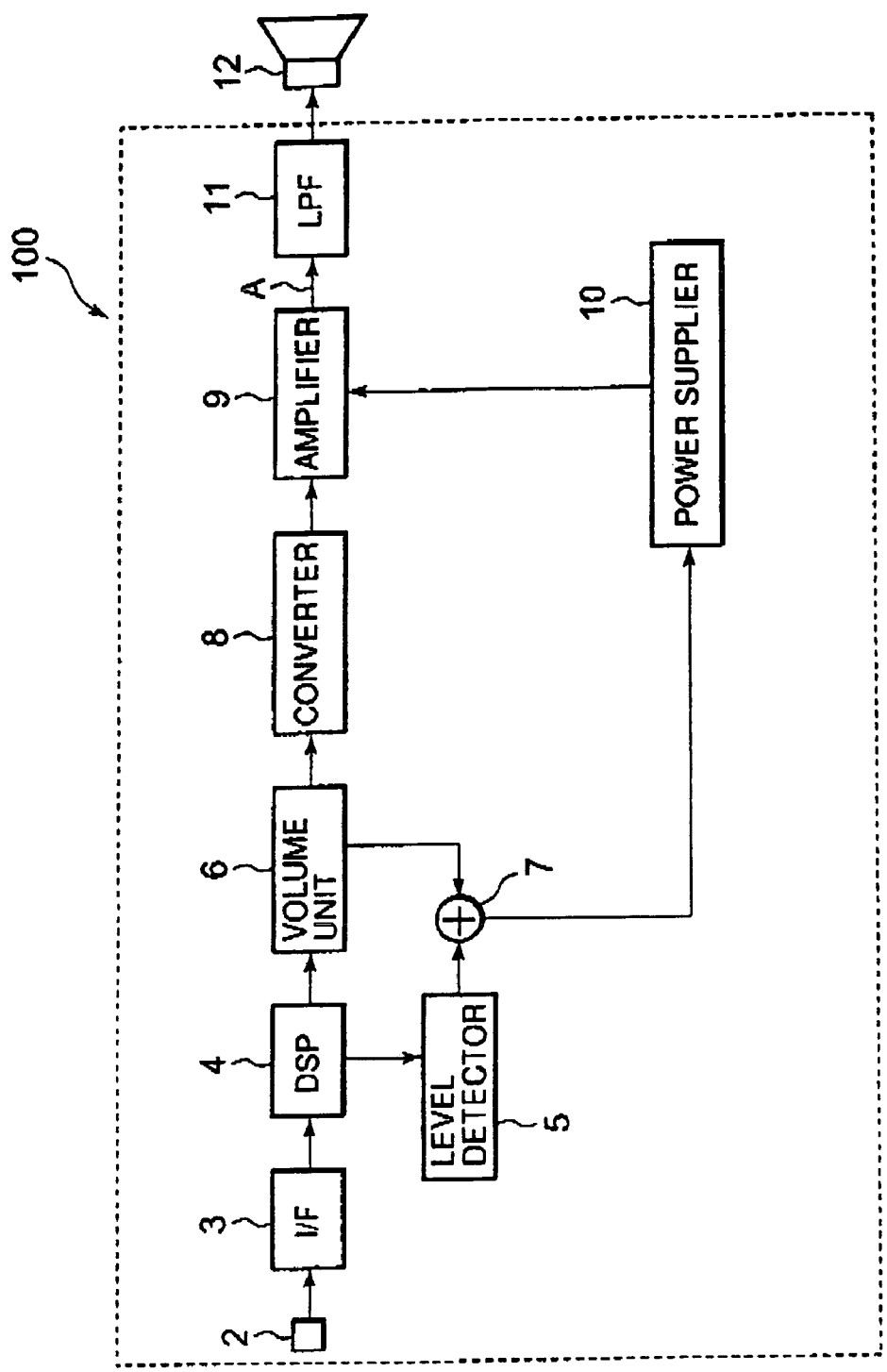
FIG. 1 is a block diagram illustrating an audio signal processing apparatus according to one embodiment of the present invention.

FIG. 1 shows an exemplary block diagram of an audio signal processing apparatus according to an embodiment of the present invention. FIG. 1 illustrates a full digitalaudio signal processing apparatus.

As illustrated in FIG. 1, according to an embodiment of the present invention, an audio signal processing apparatus 100 includes an input terminal 2 for audio signals, a digital interface (I/F) unit 3, a digital signal processor (DSP) 4, a level detector 5 configured to detect a signal level of an audio signal, a volume unit 6, a computing unit 7, a converter 8, an amplifier 9, a power supplier 10 and a low pass filter (LPF) 11.

Audio signals according to various digital interface (I/F) standards, such as IEEE 1394, Universal Serial Bus (USB), or Sony Phillips digital interface (S/P DIF), are inputted through an input terminal 2 to the audio signal processing apparatus 100. The inputted audio signals are provided to digital signal processor (DSP) 4 as data signals of a prescribed format in digital interface (I/F) unit 3.

The digital signal processor 4 includes a memory, such as a read-only memory (ROM), or a random access memory (RAM) and a register and processes data signals supplied from digital interface (I/F) unit 3 to digital signals.

Level detector 5 is configured to detect a signal level of audio data supplied to digital signal processor (DSP) 4 or a signal level of the processed digital signal.

The digital signal outputted from digital signal processor 4 is modulated in volume unit 6 and transmitted to converter 8. Simultaneously, a volume modulated signal from volume unit 6 is supplied to computing unit 7.

Computing unit 7 computes the volume modulated signal from volume unit 6 and the detected level signal from level detector 5 in order to acquire an optimum or a suitable power in accordance with signal levels of audio outputs.

The suitable power acquired in computing unit 7 is provided to power supplier 10 as a power conditioning value signal. Thus, an optimum or a suitable power is obtained by changing a current value while maintaining a constant voltage as a power condition.

It is also possible to preliminarily store characteristic data of, for example, an output stage of amplifier 9 or a power transistor (not shown), in a memory installed in digital signal processor (DSP) 4 or computing unit 7 in order to read out the stored characteristic data depending upon a computed result of computing unit 7.

Converter 8 includes a pulse width modulation (PWM) converter to convert a PWM signal. Converter 8 is configured to convert audio digital signal adjusted in volume unit 6 into a suitable signal for power amplification. Thus, the converted signal is supplied to amplifier 9.

Power supplier 10 supplies an optimum value of power to amplifier 9 based on the optimum power conditioning value signal supplied from computing unit 7 in accordance with output levels of audio signals.

Amplifier 9 includes a pre-driver configured to amplify PWM signals supplied from converter 8 and a metal oxide semiconductor field effect transistor (MOSFET) driver to perform a power amplifying operation on the output signals from the pre-driver. The MOSFET driver performs a class "D" amplification operation as a digital power amplifier.

The power amplified audio digital signal in amplifier 9 is supplied to a speaker 12 through a low pass filter (LPF) 11 and outputted as an audio signal at a required volume.

Figure 2A:
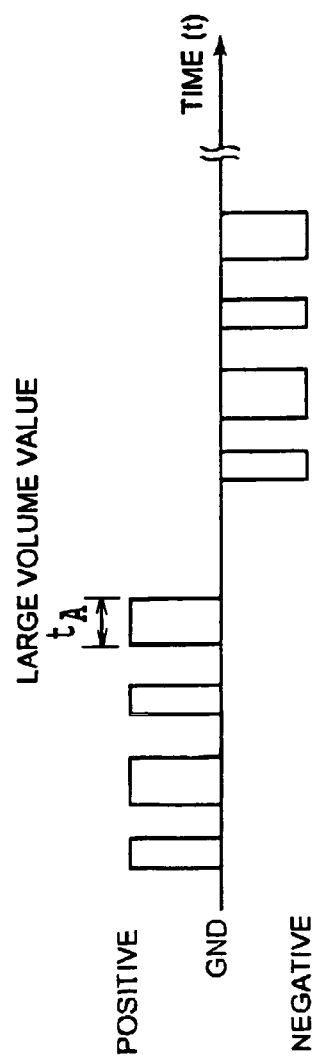
FIG. 2A is a waveform diagram of an amplifier unit output according to the embodiment of the present invention shown in FIG. 1.
Figure 2B:
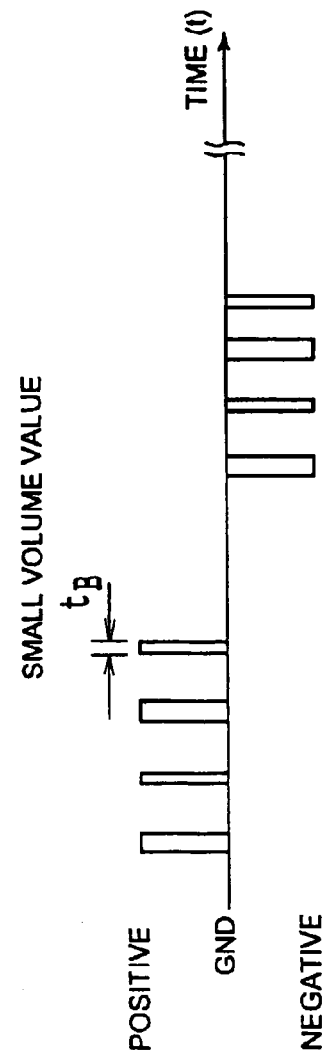
FIG. 2B according to the embodiment of the present invention shown in FIG. 1.

FIGS. 2A and 2B illustrate output waveforms of output A of amplifier 9 in the audio signal processing apparatus shown in FIG. 1. Supposing that the power supplier 10 supplies a positive and a negative power (±power) to amplifier 9, FIG. 2A shows amplified wave forms from PWM converter 8 when a volume value is large, and FIG. 2B shows amplified wave forms from PWM converter 8 when a volume value is small.

As illustrated in FIG. 2A, if the volume value is large and the input audio signal is also large, the power supplier 10 needs to supply a relatively large power to amplifier 9 since the output signals from converter 8 are continuously inputted to amplifier 9 during a relatively long time.

Since the amplifier 9 receives a desired maximum power from power supplier 10 that is previously calculated in the computing unit 7 the amplifier 9 can operate with high efficiency.

Thus, in this embodiment, a desired maximum power is previously calculated in the computing unit 7 and the optimum power is supplied to the amplifier 9 from the power supplier 10 so as to operate the amplifier with high efficiency.

On the other hand, as illustrated in FIG. 2B, when an audio input signal is relatively small and the volume value is a relatively small level or a middle level, the output signal from converter 8 is inputted to the amplifier 9 during a relatively short time. For example, an output waveform is active for a relatively long time $t_A$ in FIG. 2A and another output waveform is active for a relatively short time $t_B$ in FIG. 2B. Consequently, the amplifier 9 can be operated using minimal power.

In this case, a desired small power that is previously calculated in the computing unit 7 has been supplied to the amplifier 9 from the power supplier 10. Thus, the amplifier can be operated with high efficiency.

Accordingly, the audio signal processing apparatus consistent with the present invention can operate the amplifier 9 with high efficiency in a wide range from a small signal output power level to a large signal output power level. Consequently, compared to a conventional audio signal processing apparatus, an audio signal processing apparatus consistent with the present invention can reduce unnecessary power consumption.

In this embodiment, a current value is varied in accordance with audio output signal level while maintaining a constant voltage level in a small to a middle output area. It is, of course, possible to change both of the voltage and the current in accordance with audio output signal levels so as that the amplifier 9 can operate with high efficiency.

In the audio signal processing apparatus consistent with the present embodiment, the converter 8 and the amplifier 9 are separately constructed. It is, of course, possible to use a PWM amplifier that can perform both a signal converting process and amplification.

In the audio signal processing apparatus consistent with the present embodiment, the volume unit 6 supplies a single volume value only to the computing unit 7. Of course, it is also possible to input a plurality of volume values to the computing unit 7, and the computing unit 7 may compute a total volume value obtained as a result of computation of the plurality of volume values and an output signal from the level detector 5.

Figure 3:
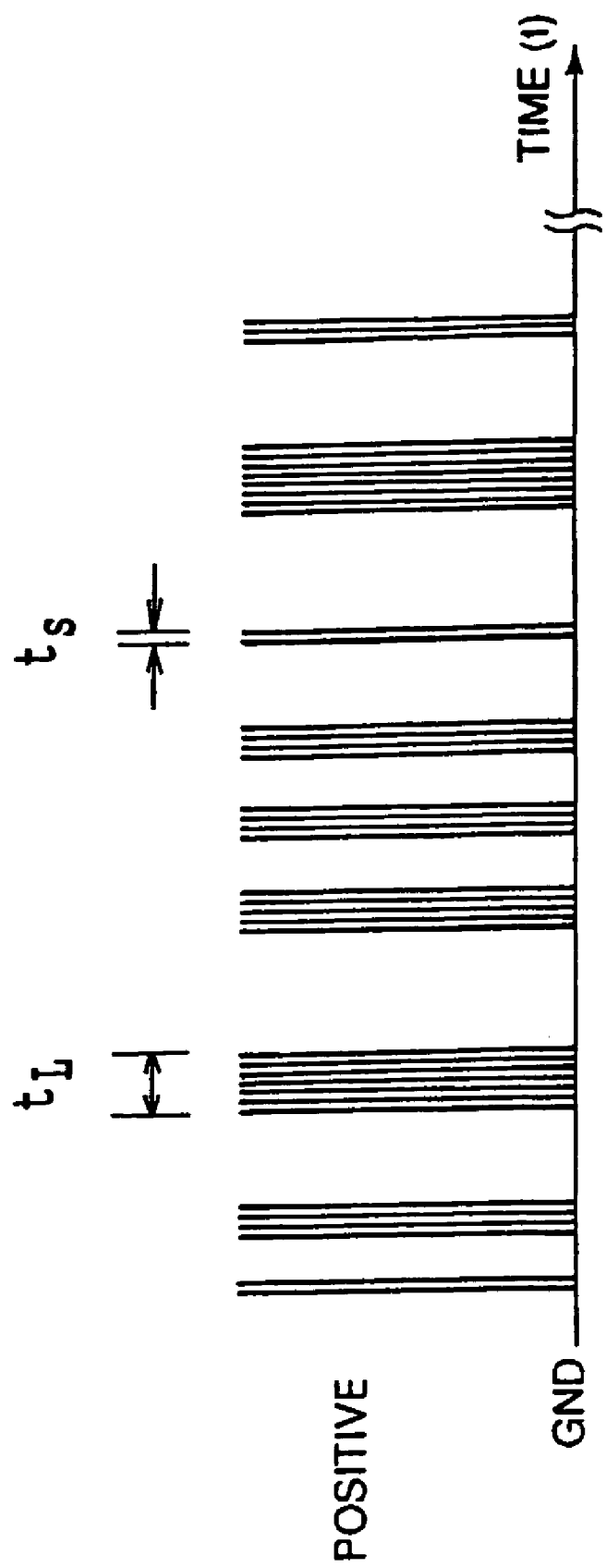
FIG. 3 is a waveform diagram of an amplifier unit output according to one embodiment of the present invention.

FIG. 3 illustrates an output wave forms from an amplifier in another embodiment of the audio signal processing apparatus consistent with the present invention. The basic construction of this embodiment is similar to the construction of the audio signal processing apparatus described above. However, different from the above-described embodiment, the present embodiment includes a one-bit converter and an amplifier that are operated using a single polarity power source, e.g. a positive polarity power source B+. The one-bit converter performs a 1 bit coded conversion while applying a $\Delta\Sigma$ modification.

Although the construction of the audio signal processing apparatus consistent with this embodiment is not shown. Basic construction is almost the same as the embodiment as the above.

As illustrated in FIG. 3, when a volume value is large and an input audio signal is also large, the 1 bit converter 8 of the audio signal processing apparatus successively supplies signals to the amplifier 9 during a relatively long time since the amplifier 9 needs a large power. The computing unit 7 has previously computed a desired maximum power so the amplifier 9 can receive sufficient power from the power supplier 10 in order to operate with high efficiency.

When the volume value is a small level to a middle level, and the input audio signal is also small, output signals from the 1 bit converter 8 are supplied to the amplifier 9 during a relatively short time. For example, output signals are supplied to the amplifier during a relatively short time $t_S$ or during a relatively long time $t_L$. Accordingly, the amplifier 9 is operated by a small power.

A desired small power that is previously calculated in the computing unit 7 is supplied to the amplifier 9. Accordingly, the amplifier can operate with high efficiency.

As explained, the audio signal processing apparatus consistent with the present embodiment uses a one-bit converter and an amplifier that operates with a single power polarity (e.g. +B) so as to achieve the same effects of the previously explained embodiment.

Of course, it is possible to construct the 1 bit converter and the amplifier in a separate bodies or in a unitized body having both function as a 1 bit amplifier that performs both signal processing and amplification.

Instead of the 1 bit converter, it is also possible to quantize to multi-bit by using, for example, a pulse coded modulation (PCM) method.

Figure 4:
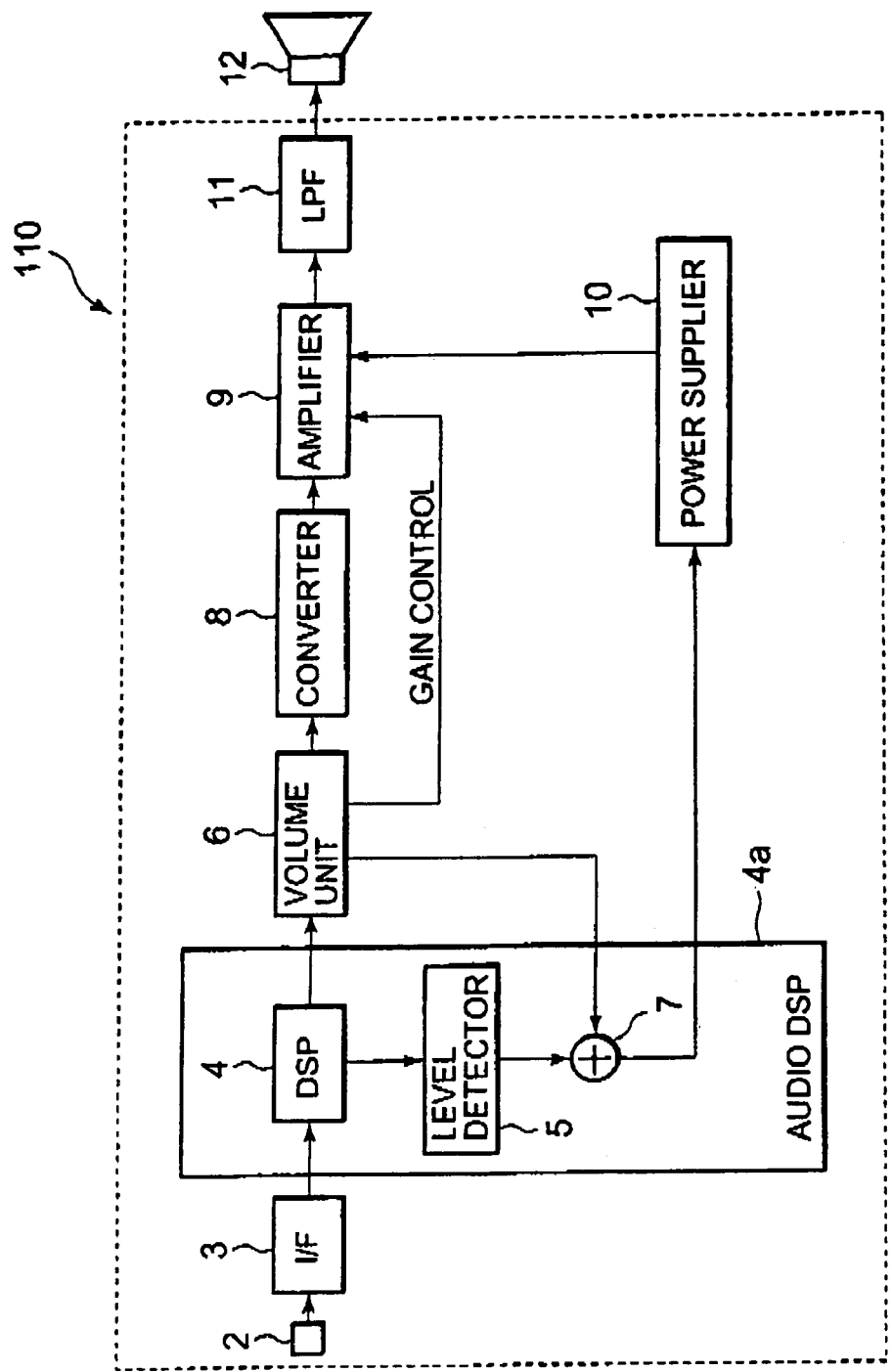
FIG. 4 is a block diagram illustrating another audio signal processing apparatus according to one embodiment of the present invention.

FIG. 4 is a block diagram illustrating a construction of a full-digital type audio signal processing apparatus consistent with the present invention. The full-digital type audio signal processing apparatus 110 includes an input terminal 2, a digital interface (I/F) unit 3, a volume unit 6, a converter 8, an amplifier 9, a power supplier 10 and a LPF 11.

Different from the embodiment illustrated in FIG. 1, the full-digital type audio signal processing apparatus includes an audio digital signal processor (audio DSP) 4a that includes a digital signal processor 4 including a memory and a register such as a ROM and a RAM, a level detector 5 and a computing unit 7.

Volume unit 6 adjusts volumes of output signals from digital signal processor (DSP) 4. The adjusted signals are provided to the computing unit 7 in the audio DSP 4a and converter 8.

The adjusted signals from volume unit 6 are supplied to amplifier 9 in order to control gain of the output signals from the amplifier 9.

In the audio signal processing apparatus consistent with the present embodiment, since a gain control function is added to the volume unit 6, it becomes possible to control gain of the output signals from amplifier 9 in addition to the features described in the embodiment illustrated in FIG. 1.

Consequently, the volume unit 6 may compute a total volume value based on both a volume value and a gain value of amplifier 9.

Figure 5:
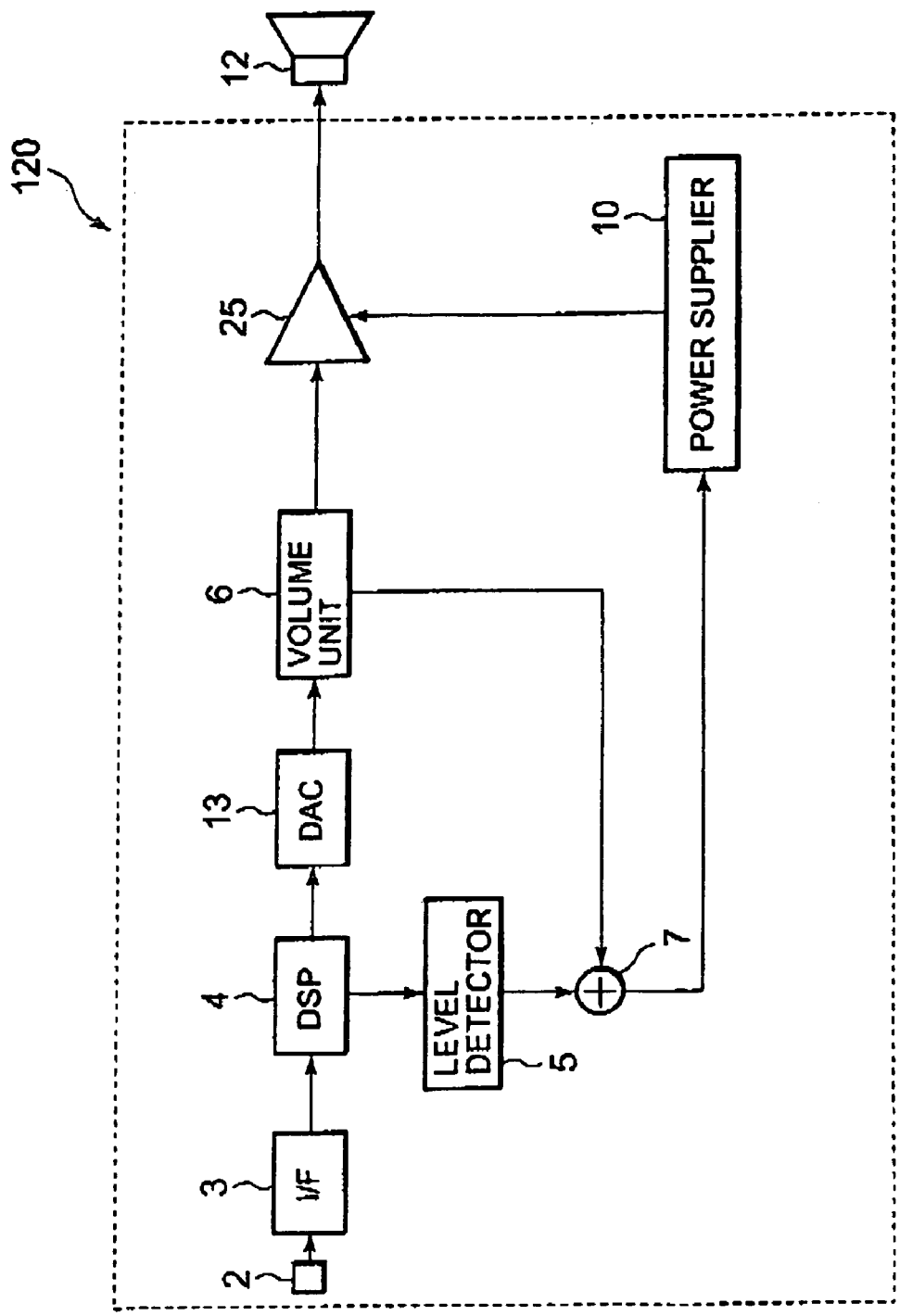
FIG. 5 is a block diagram illustrating still another audio signal processing apparatus according to one embodiment of the present invention.

FIG. 5 is a block diagram of an audio signal processing apparatus consistent with the present invention that includes an analog amplifier. The same or similar components to the components depicted in FIG. 1 are referenced using the same numbers in order to eliminate duplicate explanations.

The audio signal processing apparatus 120 depicted in FIG. 5 includes an input terminal 2, a digital I/F 3, a digital signal processor (DSP) 4, a level detector 5, a digital analog converter (DAC) 13, a computing unit 7, a volume unit 6, an analog power amplifier (PA) 25 and a power supplier 10.

Digital analog converter (DAC) 13 converts audio signals outputted from digital signal processor (DSP) 4 to analog signals.

Volume unit 6 adjusts output signals from digital analog converter (DAC) 13 to an optional volume level. The adjusted signals are supplied to power amplifier (PA) that includes of a plurality of stages of bipolar transistors.

Since the computing unit 7 has previously supplied a suitable power condition to power supplier 10, the power supplier 10 can supply an optimum or a suitable power to the power amplifier (PA) 25. Consequently, power amplifier (PA) 25 may perform as an amplifier with high efficiency.

In the audio signal processing apparatus consistent with this embodiment, when signals are inputted from volume unit 6 to power amplifier 25, the power amplifier 25 can be supplied an optimum or a suitable power that is previously calculated in computing unit 7 from power supplier 10 in accordance with audio output signal levels. Thus, it becomes possible to achieve features similar to those according to the embodiment shown in FIG. 1.

In this embodiment, power amplifier (PA) 25 includes plural stages of bipolar transistors. Of course, it is possible to use a single bipolar transistor stage.

Figure 6:
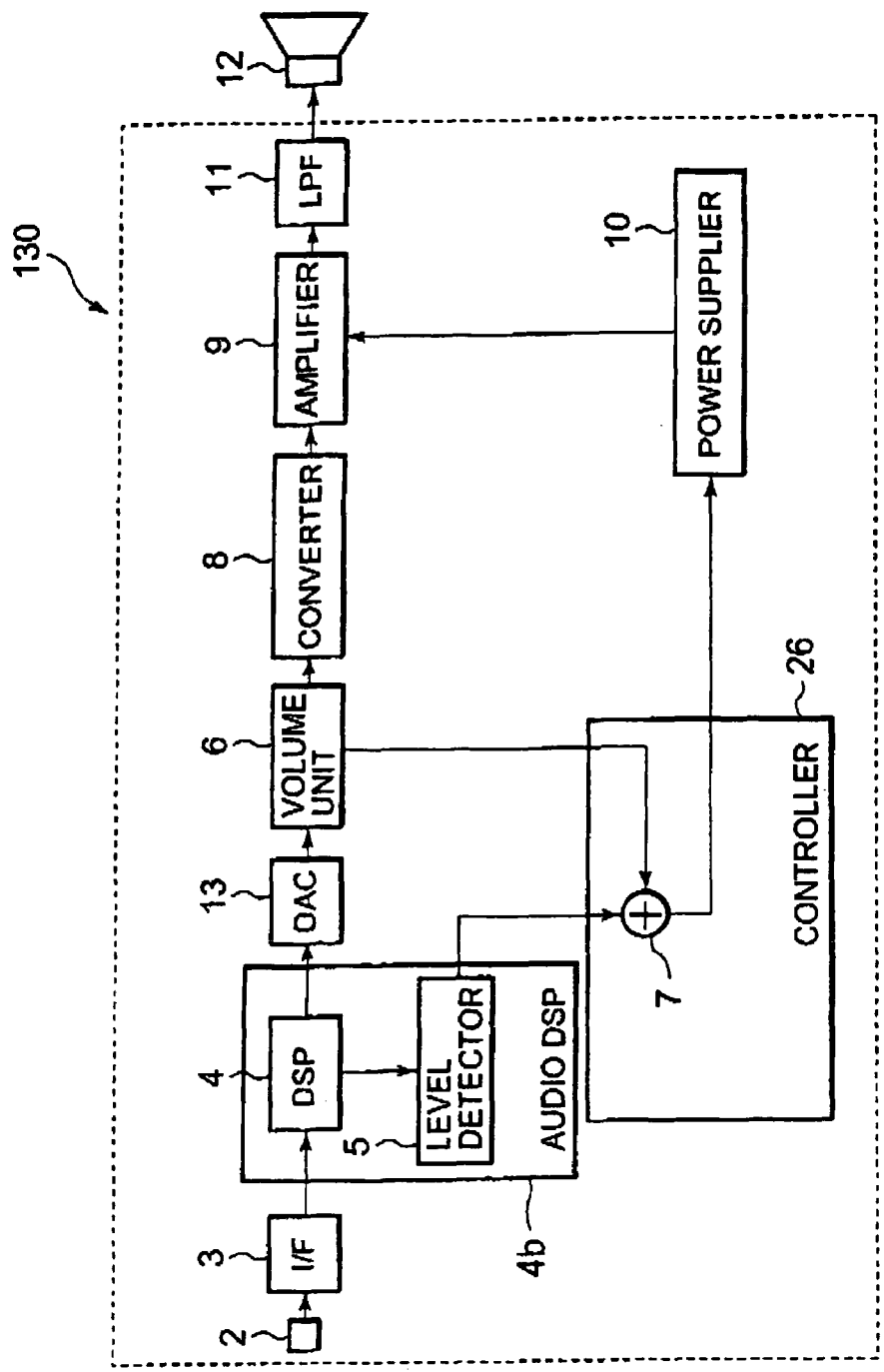
FIG. 6 is a block diagram illustrating another audio signal processing apparatus according to one embodiment of the present invention.

FIG. 6 shows a construction of a digital/analog/digital converting type audio signal processing apparatus consistent with the present invention. The same or similar components to the components depicted in FIG. 1 are referenced using the same numbers in order to eliminate duplicate explanations.

In FIG. 6, the audio signal processing apparatus 130 includes an input terminal 2, a digital I/F 3, an audio digital signal processor 41, a digital analog converter (DAC) 13, a volume unit 6, a converter 8, an amplifier 9, a power supplier 10, a LPF 11 and a controller 26.

In this embodiment, the audio input signal is input by digital I/F 3. It is, of course, possible to input analog signals to digital I/F 3 through an analog to digital converter (ADC).

Audio digital signal processor 41 includes of a digital signal processor (DSP) 4 that includes a memory and a register, such as a ROM or a RAM, and a level detector 5.

Digital analog converter (DAC) 13 converts audio signals outputted from digital signal processor 4 to analog signals.

Volume unit 6 inputs signals outputted from digital analog converter (DAC) 13 in order to provide an optional volume signal. The optional volume signal is supplied to converter 8. Controller 26 includes computing unit 7.

In the audio signal processing apparatus 130 consistent with this embodiment, a digital analog converter (DAC) 13 is provided in order to convert audio signals supplied from digital signal processor (DSP) 4 to analog signals. Volume unit 6 inputs the analog signals outputted from DAC 13 and adjusts to an optional volume. By supplying the adjusted signal to converter 8, it becomes possible to achieve features similar to those according to the embodiment shown in FIG. 1.

In the embodiments described above, the audio signal processing apparatus is applied to an audio equipment. It is possible to apply the audio signal processing apparatus consistent with the present invention to other equipment, such as video equipment having an audio output function.

Further, it is possible for an audio signal processing apparatus consistent with the present invention to be applied as a driving module in an amplifier.

In the embodiment illustrated in FIG. 6, the computing unit 7 is installed in a controller 26. It is, of course, possible to install both level detector 5 and computing unit 7 in controller 26.

Other embodiments consistent with the present invention will be apparent to those skilled in the art from consideration of the specification and practice of the present invention disclosed herein. It is intended that the specification and examples be considered as exemplary only, with a true scope and spirit of the present invention being indicated by the following claims.

The invention claimed is:

1. An audio signal processing apparatus, comprising:
   an interface unit configured to convert input audio signals to digital audio signals;
   a digital signal processor having a memory and a register, the digital signal processor being configured to process the digital audio signals converted by the interface unit;
   a volume unit configured to adjust a volume of the digital audio signals processed by the digital signal processor and generate at least one volume modulated signal;
   an amplifier having a gain value and performing operation of a power amplifier, the amplifier being configured to amplify the volume modulated signal generated by the volume unit and to output an amplified audio signal;
   a power supplier configured to supply a power to the amplifier;
   a level detector configured to detect a level of one of the digital audio signals converted by the interface unit or the processed digital audio signal and to generate a level signal;
   a calculation unit configured to calculate a power condition based on the level signal from the level detector and the at least one volume modulated signal from the volume unit, wherein a level of the power supplied by the power supplier to the amplifier is based on the calculated power condition; and
   a speaker to receive an amplified audio signal from the amplifier to output an audio signal,
   wherein the power amplification of the amplifier is based on the level signal, the volume modulated signal and the gain value of the amplifier.

2. The audio signal processing apparatus according to claim 1, wherein the digital signal processor or the calculation unit includes a memory configured to store characteristic data for the amplifier, and
   the calculation unit is further configured to calculate the power condition based on the stored characteristic data for the amplifier.

3. The audio signal processing apparatus according to claim 1, further comprising:
   a converter configured to convert the digital audio signal processed by the digital signal processor, and the amplifier is further configured to amplify the digital audio signal converted by the converter.

4. The audio signal processing apparatus according to claim 3, wherein an active time period of the audio signal amplified by the amplifier is based on the audio signal adjusted by the volume unit.

5. The audio signal processing apparatus according to claim 1, wherein the power supplier is further configured to maintain a fixed output voltage to the amplifier and vary an output current to the amplifier based on the power condition calculated by the calculation unit.

6. The audio signal processing apparatus according to claim 1, wherein the power supply is further configured to vary an output current and an output voltage supplied to the amplifier based on the power condition calculated by the calculation unit.

7. The audio signal processing apparatus according to claim 1, wherein the calculation unit is further configured to calculate a total volume value based on the at least one volume modulated signal generated by the volume unit.

8. The audio signal processing apparatus according to claim 1, further comprising:
   a digital analog converter configured to convert the digital audio signals converted by the digital signal processor to analog signals,
   wherein the volume unit is further configured to adjust a volume of the converted analog signals; and
   the calculation unit is further configured to calculate a total volume value based on the at least one volume modulated signal generated by the volume unit.

9. The audio signal processing apparatus according to claim 1, wherein the at least one volume modulated signal generated by the volume unit is supplied to the calculation unit.

10. The audio signal processing apparatus according to claim 3, wherein the converter and the amplifier are constructed in one body as a PWM amplifier.

11. The audio signal processing apparatus according to claim 3, wherein the converter includes a one bit converter configured to operate using a single polarity power source.

12. The audio signal processing apparatus according to claim 11, wherein the one bit converter and the amplifier are constructed in one body as a PWM amplifier.

13. The audio signal processing apparatus according to claim 3, wherein the converter includes a PCM multi bit converter.

14. An audio signal processing method, comprising:
   converting input audio signals to digital audio signals;
   processing the digital audio signals from the converting step to produce processed digital audio signals;
   generating at least one volume modulated signal based on the processed digital audio signals;

detecting a level of one of the digital audio signal in the converting step or the processed digital audio signal;

calculating a power condition based on the level detected in the detecting step and the at least one volume modulated signal generated in the generating step;

supplying a power to an amplifier based on the calculated power condition;

amplifying the at least one volume modulated signal with the amplifier to produce a power amplified output signal;

outputting the power amplified output signal to a speaker; and outputting an audio signal from the speaker, wherein the power amplification of the amplifier is based on the level detected in the detecting step, the volume modulated signal and a gain value of the amplifier.

15. The audio signal processing method according to claim 14, further comprising:

converting the digital audio signal from the processing step into a digital amplifier input signal for a digital amplifier.

16. The audio signal processing method according to claim 14, wherein the calculating step further comprises calculating a total volume value from the at least one volume modulated signal in the generating step.

17. The audio signal processing method according to claim 14, further comprising:

converting the digital audio signal from the processing step into an analog signal;

said generating step comprising adjusting a volume of the digital audio signal based on the converted analog signal; and calculating a total volume value based on the level detected in the detecting step and the volume modulated signal generated in the generating step.

18. The audio signal processing method according to claim 14, wherein the calculating further comprises calculating the power condition based on the at least one volume modulated signal from the generating step, the at least one volume signal includes a gain control signal, and the amplifying further comprises amplifying the processed signal based on the gain control signal.

19. An audio signal processing apparatus, comprising:

an interface unit configured to convert input audio signals to digital audio signals;

a digital signal processor having a memory and a register, the digital signal processor being configured to process the digital audio signals converted by the interface unit;

a volume unit configured to adjust a volume of the digital audio signals processed by the digital signal processor and generate at least one volume modulated signal;

an amplifier having a gain value and performing operation of a power amplifier, the amplifier being configured to amplify the at least one volume modulated signal to output an amplified audio signal;

means for supplying power to the amplifier based on a level of one of the digital audio signals converted by the interface unit or the processed digital audio signal and the at least one volume modulated signal from the volume unit; and a speaker to receive an amplified audio signal from the amplifier to output an audio signal, wherein the power amplification of the amplifier is based on the level, the volume modulated signal and the gain value of the amplifier.

* * * * *